Figure 1:
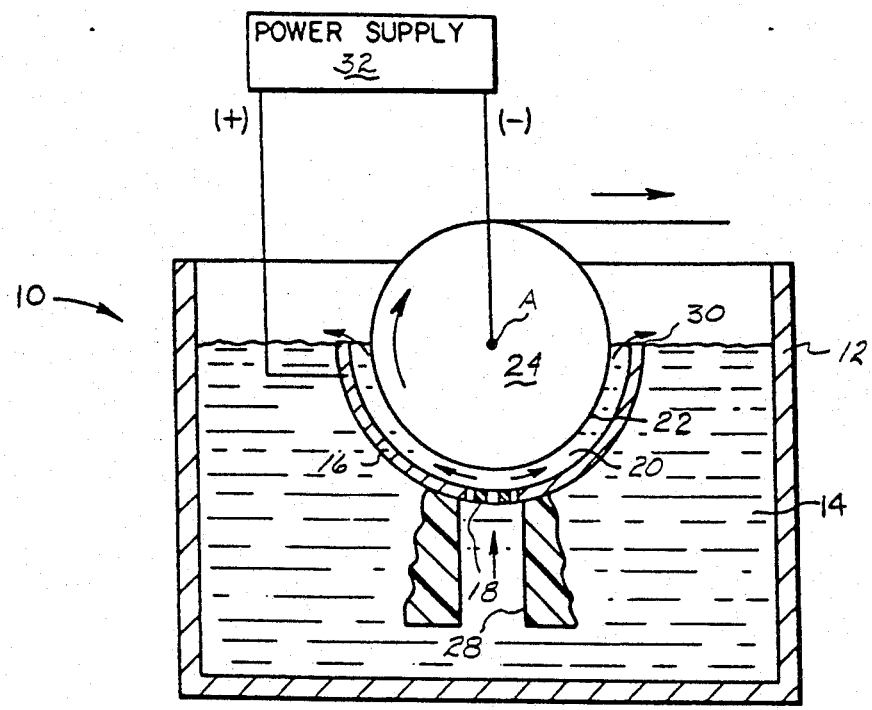

United States Patent [19]

Polan

[11] Patent Number: 4,789,438
[45] Date of Patent: Dec. 6, 1988

[54] CATHODE SURFACE TREATMENT FOR ELECTROFORMING METALLIC FOIL OR STRIP

[75] Inventor: Ned W. Polan, Madison, Conn.

[73] Assignee: Olin Corporation, New Haven, Conn.

[21] Appl. No.: 161,819

[22] Filed: Feb. 29, 1988

Related U.S. Application Data

[63] Continuation of Ser. No. 65,452, Jun. 23, 1987.

[51] Int. Cl.$^4$ .................. C25D 1/04; C25D 17/00
[52] U.S. Cl. ............................... 204/13; 204/216
[58] Field of Search ............................ 204/13, 216

[56] References Cited

U.S. PATENT DOCUMENTS

| | | | |
|---|---|---|---|
| 1,417,464 | 5/1922 | Edison | 204/13 |
| 1,543,861 | 6/1925 | McCord | 204/13 |
| 1,942,762 | 3/1934 | Levy et al. | 204/213 |
| 1,987,037 | 10/1934 | Yates | 204/13 |
| 2,335,776 | 11/1943 | Macan | 204/216 |
| 2,433,441 | 12/1947 | Davidoff | 204/13 |
| 2,865,830 | 12/1958 | Zoldas | 204/13 |
| 2,944,954 | 7/1960 | Yeck | 204/216 |
| 4,073,699 | 2/1978 | Hutkin | 204/13 |
| 4,529,486 | 7/1985 | Polan | 204/13 |

FOREIGN PATENT DOCUMENTS

| | | | |
|---|---|---|---|
| 1543301 | 4/1979 | United Kingdom | 204/13 |
| 1548500 | 7/1979 | United Kingdom | 204/13 |

Primary Examiner—T. M. Tufariello
Attorney, Agent, or Firm—Paul Weinstein

[57] ABSTRACT

An electrodeposited foil having isotropic tensile elongation properties. The foil is formed by a process and apparatus wherein the plating surface is polished in a random manner. This provides a surface finish on the plating surface having scratches extending in random directions to provide a generally isotropic surface finish.

24 Claims, 1 Drawing Sheet

CATHODE SURFACE TREATMENT FOR ELECTROFORMING METALLIC FOIL OR STRIP

This application is a continuation of application Ser. No. 65,452, June 23, 1987.

The present invention relates to a process and apparatus for forming electrodeposited metal foil or strip having superior, substantially isotropic mechanical properties.

Electroformed or electrodeposited metal foils such as E-D copper foil are used extensively in the electronic and electrical industries. One typical application for electrodeposited foil is in printed circuits. As the requirements for printed circuits become more severe because of greater design sophistication, so have the requirements imposed upon the copper foil producers. Printed circuit manufacturers desire the foil to be substantially pore free and to possess superior mechanical properties. The techniques and equipment used to make these foils must therefore be capable of producing foil with the desired quality.

As can be seen from U.S. Pat. Nos. 1,417,464 to Edison and 1,543,861 to McCord, the basic electroforming technology is old and well known. Generally, electrodeposited metal foil is formed by immersing an anode and a moving plating surface in an electrolyte containing a concentration of metal values to be plated and applying an electrical current between the anode and the plating surface so as to deposit a relatively smooth layer of metal on the surface. As the plating surface and the newly plated foil emerge from the electrolyte, the foil is peeled from the plating surface and coiled onto a take-up reel.

It has been long recognized that electrodeposited foil quality can be improved by using a rotating chromium plated steel drum to produce electrodeposited copper foil.

Techniques such as polishing of the plating surface prior to immersion in the plating electrolyte have been used in an attempt to provide better quality foil. In these techniques, a driven brush is generally used to remove foreign matter and oxides from the plating surface. In order to provide the freshest possible surface, the brush is typically positioned close to the point where the moving plating surface enters the electrolyte. U.S. Pat. Nos. 1,952,762 to Levy et al., 2,335,776 to Macan, 2,865,830 to Zoldas, and 2,944,954 to Yeck and U.K. Pat. Nos. 1,543,301 and 1,548,550 illustrate electroforming systems having drum polishing rolls. U.S. Pat. No. 1,978,037 to Yates illustrates an electroforming apparatus wherein a rubber-abrasive belt is used in lieu of a roll to polish the plating surface.

Such techniques provide a circumferential polishing of the moving plating surface whether a drum or a belt. The result is an anisotropic distribution of polishing marks or scratches. Such scratches extend in a generally longitudinal direction around the circumference of the drum. "Longitudinal" as the term is used herein refers to the direction of movement of the plating surface. If the polishing roll or brush merely rotates in a stationary position, the polishing marks lie in the longitudinal direction parallel to one another. This results in a coarser surface finish transversely of the plating surface as compared to the longitudinal direction. The result of plating such a surface having anisotropic surface scratches or marks is that the foil which is produced thereby also has anisotropic properties and, in particular, the transverse tensile elongation properties of the foil are markedly poorer than the longitudinal properties. In summary, such circumferential polishing produces foil which can exhibit mechanical properties which are significantly poorer in one direction than another. This disparity in mechanical properties is believed to be the result of the circumferential polishing done on the plating surfaces by the polishing rolls or belts.

Systems using a moving endless belt in lieu of a rotating drum type cathode have been used in an attempt to produce better quality foil. In these systems, the electrodeposited foil is formed either on the belt itself or on a fresh layer formed on a surface of the belt. Preparation of the plating or belt surface often includes a cleaning and/or roughening operation. For example, in U.S. Pat. No. 2,433,441 to Davidoff, the endless belt is subjected to a polishing operation after the plated foil has been removed. While this polishing operation uses a plurality of reciprocatory polishing heads, it is intended only to remove contaminants and other impurities from the surface of the belt. It does not appear intended to abrade the surface of the belt. U.S. Pat. No. 4,073,699 to Hutkin illustrate a belt plating system in which the endless belt is subjected to a roughening treatment in preparation for subsequent plating.

In accordance with this invention, a system capable of forming substantially pore-free electrodeposited metal foil characterized by substantially uniform or isotropic mechanical properties has been devised. The electroforming apparatus of the present invention comprises: an electrochemical cell; an electrolyte containing a concentration of metal values to be plated; an anode at least partially immersed in the electrolyte; and a moving plating surface having an isotropic surface finish. The moving plating surface may be a rotating drum cathode or an endless belt. The desired isotropic surface finish is preferably imparted to the plating surface by using a series of polishing steps with each step using an abrasive device having sequentially finer grit sizes generally in the range of from about 320 to about 600 grit. While it is preferred that each step be performed so as to impart a random finish to the plating surface, only the last step in the series needs to impart such a finish to the plating surface.

Alternatively, though less preferred, it has been found that foil having improved mechanical properties in an isotropic sense can be produced by imparting to the plating a surface finish which is equally distributed in both a first longitudinal direction parallel to the direction of travel of the plating surface and a second direction transverse to the first direction.

It is an aim of the present invention to form electrodeposited metal foil characterized by substantially isotropic mechanical properties.

It is a further aim of the present invention to form an electrodeposited metal foil as above which is also substantially pore free.

It is a further aim of the present invention to form an electrodeposited metal foil as above suitable for use in electronic and electrical applications.

It is a further aim of the present invention to provide a process and apparatus for forming the above metal foil.

These and other aims and advantages will become more apparent from the following description and drawing in which like reference numerals depict like elements.

FIG. 1 is a view in partial cross section of an electroforming apparatus in accordance with the present invention.

The present invention relates to a process and apparatus for forming substantially pore free electrodeposited metal foil characterized by substantially isotropic mechanical properties. As used herein, the term isotropic refers to substantially uniform properties at least along the longitudinal and transverse axes of the electrodeposited metal foil and generally in all directions of the foil plane. As used herein, the term foil also refers to electroformed metal in strip or bar form.

Referring now to FIG. 1, an electroforming apparatus 10 in accordance with the present invention is illustrated. The apparatus 10 includes a tank 12 for holding an electrolyte 14. The tank 12 is preferably formed from an inert material such as lead or stainless steel; although, it may also be formed from a structural material such as concrete which is then lined with a corrosion resistant material such as rubber or polyvinyl chloride.

The apparatus 10 further includes an anode 16 preferably having an arcuate shape and a central perforated zone 18. The anode 16 may be formed from any suitable electrically conductive, insoluble metal or metal alloy. Typical anode materials include lead, antimony and alloys thereof. If desired, the central perforated zone 18 may be formed from a different material than the rest of the anode 16. For example, the perforated zone 18 may be formed from a material more resistant to erosion than the material forming the rest of the anode 16. The anode 16 is described in more detail in U.S. Pat. No. 4,529,486 to Polan, which is hereby incorporated by reference herein.

The anode 16 may be mounted in the tank 12 in any desired manner using any suitable means (not shown) known in the art. Generally, the anode 16 is mounted in a way which provides a substantially uniform interelectrode gap 20 with the moving plating surface 22 of a drum cathode 24 mounted for rotation about an axis A. Typically, the axis A is a substantially horizontal axis. Any suitable means known in the art may be used to mount the drum cathode 24 in the tank 12. Preferably, the cathode 24 is mounted so that about half of it extends beneath the surface of the electrolyte 14.

The rotating drum cathode 24 may be formed from any suitable electrically conductive metal or metal alloy including but not limited to lead, stainless steel, columbium, tantalum, titanium, chromium and alloys thereof. In a preferred embodiment, the drum cathode 24 comprises a stainless steel drum having a plating surface 22 formed from titanium, columbium, tantalum, or alloys thereof. As will be discussed in more detail hereinafter, the plating surface 22 is preferably characterized by an isotropic surface finish in accordance with this invention. The drum cathode 24 may be rotated by any suitable motor drive system (not shown) known in the art.

The anode 16 and the cathode 24 must be mounted in the tank 12 so that the interelectrode gap 20 is not too wide. If the gap 20 is too wide, there could be a significant IR loss across the gap. Practically, this means that the interelectrode gap 20 should be less than about 50 millimeters. Preferably, the gap 20 is in the range of from about 5 millimeters to about 40 millimeters, most preferably from about 15 millimeters to about 30 millimeters.

The electrolyte 14 in the tank generally comprises an aqueous acidic solution containing a concentration of metal ions to be deposited onto the plating surface 22.

For example, if copper foil is to be formed, the electrolyte 14 would contain a concentration of copper ions. During plating, it is desirable to maintain the electrolyte at a temperature in the range of from about room temperature to about 100° C. To this end, the tank 12 may be provided with any suitable means (not shown) known in the art for maintaining the electrolyte at a desired temperature. For example, a heating/cooling loop not shown may be incorporated into or connected to the tank 12.

When forming electrodeposited copper foil, a copper sulfate-sulfuric acid electrolyte may be used. It has been found that particularly good quality foil can be formed using an electrolyte at a temperature of about 60° C. At this temperature, the electrolyte contains from about 10 grams/liter to about 320 grams per liter, preferably from about 100 grams/liter to about 300 grams per liter, of copper, generally in the form of copper sulfate. The electrolyte also contains sulfuric acid in a concentration up to that which causes copper to precipitate out as copper sulfate, preferably from about 10 grams per liter to about 100 grams per liter. However, in accordance with this invention, any desired electrolyte can be used.

The apparatus 10 further includes a manifold 28 through which fresh electrolyte is provided in a substantially continuous fashion to the interelectrode gap 20. The manifold 28 may be mounted in the tank 12 in any desired manner and suitably connected to a source of electrolyte by any desired means.

Typical electrolyte flow rates used with the apparatus of the present invention are in the range of from about 1 meter/second to about 4 m/sec., preferably from about 1 m/sec. to about 2.5 m/sec. Normally, electrolyte will flow through the manifold 28, through the perforations in the perforated zone 18 of the anode into the interelectrode gap 20, over the edges 30 of the arcuate anode 16, and back into the tank 12. If desired, the manifold may be connected to a pump not shown to create the desired electrolyte flow throughout the cell. If a pump is utilized, any appropriate conventional pump known in the art may be used.

Finally, the apparatus 10 includes a power supply 32 to which the cathode 24 and the anode 16 are electrically connected. The power supply 32 is used to apply an electroplating current having a current density in the range of from about 0.4 Amps/centimeter squared to about 2.0 A/cm$^2$, preferably from about 0.5 A/cm$^2$ to about 1.5 A/cm$^2$, between the anode and the cathode. The power supply 32 may comprise any suitable conventional power supply known in the art for applying either an AC or a DC current.

In accordance with the present invention, substantially isotropic mechanical properties are imparted to the electrodeposited foil by providing the plating surface 22 with a generally isotropic finish. This is accomplished by subjecting the plating surface 22 to a series of sequential polishing steps preferably prior to installing the cathode 24 in the tank 12. The polishing steps are intended to impart the desired surface finish. One of the advantages of the present technique can be that by performing the plating surface preparation steps prior to cathode installation, one avoids particulate material from the surface preparation steps contaminating the electrolyte. Other advantages associated with the present technique include the creation of a plating surface which maintains good mechanical attachment to the foil during the electroforming process and which does not require frequent surface preparation.

The initial surface preparation or polishing step preferably comprises abrading or grinding the plating surface 22 with, for example, a polishing paper having a grit size in the range of from about 320 to about 600 grit. While the surface may be polished in any desired manner during this step, it is preferred to use a generally random motion. This can be done using a manually operated abrading device having an orbital polishing motion or any other suitable means known in the art. Following the initial surface preparation step, one or more additional polishing steps are carried out. Each subsequent polishing step uses an abrading device, such as polishing paper, having a grit size finer than that used in the previous polishing step. Each subsequent polishing step should preferably remove any scratches from the preceding step. These steps preferably also use a generally random motion as by the use of an orbital polishing device.

The final polishing step above in the sequence is the most important because it must impart a finish to the plating surface in which the scratches or polishing marks are substantially randomly oriented. It is important that the plating surface after the final polishing step be neither too smooth nor too rough. If it is too smooth, the foil will fall off prematurely durig processing. If it is too coarse, the foil cannot be readily stripped from the plating surface 22.

While it is preferred to use random motion during the polishing steps, it has also been found that motions which create a surface pattern which is substantially equally distributed in both a first direction parallel to the longitudinal direction of movement of the plating surface 22 and a second direction transverse to the first, may be used to create a surface finish capable of producing foil having near isotropic mechanical properties.

Each of the polishing steps may be performed while the plating surface is either dry or wet. If performed wet, either water or a suitable lubricant such as kerosene or some other lubricant may be applied to the surface prior to polishing.

For printed circuit applications which generally employ copper foil, a mechanical property of particular interest is the ductility of the foil which is generally measured as a tensile elongation. It has been found that prior art foils can have highly anisotropic ductilities. For example, longitudinal tensile elongations measured over a 2" gauge length have been found to be about 17%; whereas, corresponding transverse tensile elongations have been found at about 11%. A tensile elongation of at least 15% is highly desirable; however, that tensile elongation property of the foil should be isotropic rather than anisotropic. Namely, it should be approximately the same whether the property is measured longitudinally or transversely of the foil. The aforenoted foil comprised a 1 ounce per square foot, class 1, copper foil.

The smooth side of the foil, e.g., the side facing the drum, showed longitudinal markings indicative of circumferential scratches or polishing marks on the drum surface. Quantitative measurement of this surface roughness showed roughness values of from about 35 to 50 micro inches in the transverse direction versus roughness values of about 15 to about 35 micro inches in the longitudinal direction. In accordance with this invention, it has been found that anisotropic surface roughness as exhibited by the prior art foil plays a major role in the resultant anisotropic elongation properties.

Accordingly, in accordance with this invention, the surface roughness values for the plating surface 22 are preferably from about 5 to about 40 micro inches and, most preferably, from about 5 to about 30 micro inches and those surface roughness values are approximately the same in either the longitudinal or transverse directions on the plating surface and, preferably, in substantially all directions in the plating surface. By substantially the same, it is meant that the surface roughness values in the respective directions are within approximately about 20%, preferably, within about 15% and, most preferably, within about 10% of one another.

To demonstrate the present invention, the following example was performed.

EXAMPLE

An isotropic surface finish comprising a series of randomly oriented scratch marks was imparted to a one foot diameter, one foot long drum plating surface of titanium using a conventional hand-held orbital sander. The surface was initially polished using 320 grit polishing paper. Subsequent polishing steps were performed with finer papers through 400 grit.

Copper foil of 1 oz/ft$^2$ weight was electroformed on this drum using an apparatus similar to that shown in FIG. 1. The electrolyte contained 1.7 Molar $CuSO_4$ and 0.4 Molar $H_2SO_4$ and was maintained at a temperature of 60° C. An electrolyte flow rate of 1.3 meters/second was maintained through the interelectrode gap and a current having a current density of 0.6 Amps/centimeter squared was applied.

Examination of the copper foil revealed an isotropic surface roughness on the smooth or drum side of the foil of from about 15 to about 25 micro inches, in both the longitudinal and transverse directions. The ductility of the foil was also found to be isotropic and had a high 16% longitudinal elongation and 17% transverse elongation over a two inch gauge length. This superior isotropic ductility is of major importance in the printed circuits which are subject to significant thermal stresses, particularly multilayer circuits.

While the present invention has been described in terms of imparting a certain surface finish to a rotating drum cathode, it should be apparent that the surface finish preparation steps of the present invention could also be used in conjunction with an endless belt type electroforming apparatus where the belt comprises both the cathode and the plating surface 20.

The patents and patent publications set forth in the specification are intended to be incorporated by reference herein.

"Surface roughness" as the term is used herein comprises an average surface roughness for the material and can be readily measured by any conventional profilometer.

It is apparent that there has been provided in accordance with this invention a cathode surface treatment for electroforming metal foil or strip which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed:

1. An electrodeposited metal foil suitable for use in electronic and electrical applications being characterized by substantially isotropic tensile elongation properties, said foil having a first major surface whose surface roughness in a longitudinal direction is within about 20% of its surface roughness in a transverse direction.

2. The foil of claim 1 wherein the surface roughness of said first surface in the longitudinal direction is within about 10% of the surface roughness in the transverse direction.

3. The foil of claim 1 wherein said foil is a substantially pore free copper foil for a printed circuit.

4. The foil of claim 1 wherein the surface roughness of said first major surface in the longitudinal direction is from about 5 to about 30 micro inches and wherein the surface roughness of said first major surface in the transverse direction is from about 5 to about 30 micro inches.

5. The foil of claim 4 wherein said surface roughnesses are from about 5 to about 30 micro inches and wherein said tensile elongation properties are generally isotropic in substantially any direction in said plane of said foil.

6. A process for providing an improved plating surface for forming electrodeposited metal foil, said process coprising:
polishing said plating surface in a generally random fashion to provide a surface roughness in a longitudinal direction which is within about 20% of the surface roughness of said surface in a transverse direction.

7. A process as in claim 6 wherein said polishing step comprises:
subjecting said plating surface to a plurality of sequential polishing steps; and
each said polishing step comprising abrading said surface with an abrasive having a particularly grit size, wherein succeeding polishing steps utilize an abrasive grit size finer than that used in the previous polishing step.

8. A process as in claim 7 wherein at least the final polishing step comprises polishing said plating surface using a random motion so as to form a series of randomly oriented scratches in said plating surface.

9. A process as in claim 8 wherein each said polishing step comprises polishing said plating surface using a random motion so as to form a series of randomly oriented scratches in said plating surface, with each succeeding step removing the scratches formed by preceding steps.

10. A process for forming electrodeposited metal foil having substantially isotropic tensile elongation properties comprising:
providing a cell with an electrolyte containing a concentration of metal ions and a first electrode at least partially immersed in said electrolyte;
providing a second electrode having a plating surface;
polishing said plating surface in a generally random fashion to provide a surface roughness in a longitudinal direction which is within about 20% of the surface roughness in a transverse direction;
arranging said second electrode in said electrolyte so as to form an interelectrode gap with said first electrode;
moving said plating surface relative to said first electrode;
flowing an electrolyte at a desired flow rate into said interelectrode gap; and
applying a current between said electrodes to form said foil having said substantially isotropic tensile elongation properties.

11. The process of claim 10 further comprising:
polishing said substantially isotropic plating surface on said second electrode prior to said arranging step.

12. The process of claim 11 wherein said polishing step comprises:
subjecting said plating surface to a plurality of sequential polishing steps;
each said polishing step comprising abrading said surface with an abrasive having a particular grit size, wherein succeeding polishing steps utilize an abrasive grit size finer than that used in the previous polishing step.

13. The process of claim 12 wherein at least the final polishing step comprises polishing said plating surface using a random motion so as to form a series of randomly oriented scratches in said plating surface.

14. The process of claim 10 wherein each of said polishing steps comprises polishing said plating surface using a random motion so as to form a series of randomly oriented scratches in said plating surface, with each succeeding step removing the scratches formed by preceding steps.

15. The process of claim 10 wherein said polishing step comprises polishing said surface so as to form scratch marks in said plating surface which are equally distributed in a first longitudinal direction parallel to the direction of movement of said plating surface and in a second direction transverse to said first direction.

16. A substantially pore free metal foil having substantially isotropic tensile elongation properties formed by the process of claim 10.

17. An apparatus for forming electrodeposited foil having substantially isotropic mechanical properties comprising:
a tank for holding an electrolyte containing a concentration of metal ions;
a first electrode mounted in said tank so as to be at least partially immersed in said electrolyte;
a second electrode mounted in said tank so as to form an interelectrode gap with said first electrode;
said second electrode having a plating surface with a substantially isotropic surface finish;
means for flowing said electrolyte through said interelectrode gap at a desired flow rate; and
means for applying a current across said electrodes so as to form said foil having said substantially isotropic tensile elongation properties on said plating surface.

18. The apparatus of claim 17 wherein said substantially isotropic surface finish comprises a series of randomly oriented scratch marks in said plating surface.

19. The apparatus of claim 18 further comprising:
said plating surface being movable in a first direction; and
said substantially isotropic surface finish comprising a pattern of scratch marks equally distributed in both a direction parallel to said first direction and a direction transverse to said first direction.

20. An electrodeposited metal foil as in claim 1 which comprises copper and which is adapted for use in a printed circuit board.

21. An apparatus as in claim 18 wherein said substantially isotropic surface finish comprises a surface having a surface roughness in a longitudinal direction within about 20% of the surface roughness in a transverse direction.

22. An apparatus as in claim 21 wherein said surface roughness in said longitudinal direction is within about 10% of said surface roughness in said transverse direction.

23. An apparatus as in claim 21 wherein said surface roughness in said longitudinal direction is from about 5 to about 30 micro inches and wherein said surface roughness in said transverse direction is from about 5 to about 30 micro inches.

24. An apparatus as in claim 23 wherein said surface roughnesses are from about 5 to 30 micro inches.

* * * * *